(12) United States Patent
Wang et al.

(10) Patent No.: US 8,747,625 B2
(45) Date of Patent: Jun. 10, 2014

(54) GRINDING/ELECTROLYSIS COMBINED MULTI-WIRE-SLICING PROCESSING METHOD FOR SILICON WAFERS

(75) Inventors: Wei Wang, Jiangsu (CN); Zhengxun Liu, Jiangsu (CN)

(73) Assignee: Nanjing University of Aeronautics and Astronautics (CN)

(*) Notice: Subject to any disclaimer, the term of this patent is extended or adjusted under 35 U.S.C. 154(b) by 74 days.

(21) Appl. No.: 13/639,847

(22) PCT Filed: Jul. 14, 2010

(86) PCT No.: PCT/CN2010/075147
§ 371 (c)(1),
(2), (4) Date: Dec. 12, 2012

(87) PCT Pub. No.: WO2011/124044
PCT Pub. Date: Oct. 13, 2011

(65) Prior Publication Data
US 2013/0075274 A1    Mar. 28, 2013

(30) Foreign Application Priority Data

Apr. 8, 2010    (CN) .......................... 2010 1 0141727

(51) Int. Cl.
*B23H 5/00*    (2006.01)
*B23H 5/06*    (2006.01)
*B23H 5/08*    (2006.01)
*B23H 5/10*    (2006.01)
*H01L 21/02*    (2006.01)
*B23H 1/00*    (2006.01)
*B23H 7/02*    (2006.01)
*B23H 7/08*    (2006.01)

(52) U.S. Cl.
CPC .. *B23H 5/08* (2013.01); *B23H 5/00* (2013.01); *B23H 5/06* (2013.01); *B23H 5/10* (2013.01); *B23H 7/02* (2013.01); *B23H 7/08* (2013.01); *H01L 21/02* (2013.01); *H01L 21/02002* (2013.01); *B23H 1/00* (2013.01)
USPC ......................................................... 204/164

(58) Field of Classification Search
None
See application file for complete search history.

(56) References Cited

U.S. PATENT DOCUMENTS 5,171,956 A    12/1992    Haruki et al.

FOREIGN PATENT DOCUMENTS

| CN | 1531747 A | 9/2004 |
|---|---|---|
| CN | 101003100 A | 7/2007 |

(Continued)

OTHER PUBLICATIONS

Handa et al., JP 2000109397 A, machine translation (2000).*

(Continued)

*Primary Examiner* — James Lin
*Assistant Examiner* — Ho-Sung Chung
(74) *Attorney, Agent, or Firm* — Christie, Parker & Hale, LLP

(57) ABSTRACT

A grinding/electrolysis combined multi-wire-slicing processing method for silicon wafers includes the following steps: first, with a metal slicing wire (10) provided on a multi-wire-slicing machine serving as cathode, a silicon rod or a silicon ingot (1) (anode) is processed by grinding/electrolysis combined multi-wire-slicing through application of a voltage; second, during said processing, the metal slicing wire (10) and the silicon rod or a silicon ingot (1) are connected with a low-voltage continuous or pulsed direct current power supply (9); third, an electrolytic liquid is sprayed into the cutting area to ensure cooling and anode erosion. The method reduces macroscopic cutting force and enables a grinding/electrolysis combined multi-wire-slicing processing method for large size ultra-thin silicon wafers.

6 Claims, 1 Drawing Sheet

(56) References Cited

FOREIGN PATENT DOCUMENTS

| CN | 101101937 A | | 1/2008 |
|---|---|---|---|
| CN | 101342622 A | | 1/2009 |
| JP | 2000109397 A | * | 4/2000 |
| JP | 2008-149439 | | 7/2008 |
| WO | WO 02/075804 A2 | | 9/2002 |
| WO | WO 2006/000200 A1 | | 1/2006 |

OTHER PUBLICATIONS

Handa et al., Derwent English Abstract of Handa, 2000-344892 (2000).*

International Search Report, dated Jan. 13, 2011, corresponding to PCT/CN2010/075147, 7 pages.

* cited by examiner

GRINDING/ELECTROLYSIS COMBINED MULTI-WIRE-SLICING PROCESSING METHOD FOR SILICON WAFERS

CROSS-REFERENCE TO RELATED APPLICATION(S)

This application is a National Phase Patent Application and claims priority to and benefit of International Application Number PCT/CN2010/075147, filed on Jul. 14, 2010, which claims priority to and benefit of Chinese Patent Application Number 201010141727.3, filed on Apr. 8, 2010, the entire disclosure of which are incorporated herein by this reference.

FIELD OF THE INVENTION

The present invention relates to a method for cutting silicon wafers by using grinding/electrolysis combined processing technology, specifically to a grinding electrolysis combined multi-wire-slicing processing for silicon wafers. This method is also applicable to the grinding electrolysis combined multi-wire-slicing processing of semiconductor materials.

BACKGROUND OF THE INVENTION

Silicon wafer is a main production raw material on semiconductor and photovoltaic industrial chains. MWS (Multi-Wire-Slicing) is a process for cutting brittle and hard materials (such as silicon ingot). Different from conventional inner diameter and outer diameter sawing method, its principle is that a high-speed moving metal slicing wire (typically a steel wire) drives the free slurry (or fixed abrasive, which has the higher production efficiency, but the cost is high, too) attached to it to grind silicon ingots, thereby achieving the purpose of slicing. In the whole slicing process, the steel wire, guided by a wire roller, form a wire net on the main wire roller, the feeding of the work piece to be processed is realized through the movement of the workbench, and hundreds of slices may be cut simultaneously. Compared with the existing slicing methods, it has remarkable advantages, such as high efficiency and high accuracy.

Currently thin silicon wafers with a large area (30 cm×30 cm) can be produced by MWS method, but as it is non-rigid slicing, inevitably the metal slicing wires are deformed and consequently generate instantaneous impact on the cut silicon wafers continuously in the slicing process. Meanwhile, the cooling of the steel wires in the kerf should also be considered. Technically speaking, it is rather difficult to further reduce the thickness of existing large-size silicon wafers, increase the slicing thickness of silicon wafers, control slicing loss and realize cost-effective and efficient slicing.

In the recent years, to address the application requirements on silicon wafer slicing technology, new process are searched at home and abroad in addition to the research on MWS. One of them is WEDM (Wire cut Electrical Discharge Machining). In this method, the wire electrodes typically are copper wires or molybdenum wires. Belgian Leuven University researched the slicing of silicon wafers by adopting low-speed WEDM. Japanese Okayama University researched the slicing processing of monocrystalline silicon rods by adopting WEDM and using deionized water as the working solution, and developed multi-wire electrical discharge slicing principle prototype (composed of a plurality of independent wire feeding systems). The basis of this method is that the monocrystalline silicon ingots formed by oriented growth has very low resistivity (0.01 $\Omega \cdot cm$), making the slicing of silicon ingots by WEDM technology possible. The total thickness variation (TTV) and warp of silicon wafers obtained by WEDM are almost the same as the results of MWS.

The loss of silicon material caused by the kerf is about 250 $\mu m$, equivalent to the value obtained from MWS. Nonetheless, in the foregoing relevant research, deionized water is used as the working medium, so the discharge energy is large and there is obvious heat affected zones on the surface of the silicon wafers and the processing efficiency is not high (at present, the highest slicing efficiency <100 $mm^2/min$). Furthermore, the residue of metal elements on the surface of the silicon wafers is not considered. For this reason, it still can not compatible with solar energy silicon wafer cell manufacturing process.

Nanjing University of Aeronautics and Astronautics adopted an electric spark/electrolysis combined processing method to research the integration of slicing and texturing of solar energy silicon wafers (invention patent No.: ZL200710025572.5). Both heat affected zones and metal element residue are effectively controlled and single-wafer slicing efficiency is raised significantly. However, during MWS of silicon wafers, the discharge current is too large and wires are prone to breaking. As a result, this method can not be applied in MWS technology.

American Applied Materials, Inc. researched the planarization of substrate by electrochemical mechanical grinding method (invention patent No.: ZL02803505.4), and realized a method for planarizing substrate surface by a low contact pressure between the substrate and the grinding device.

DISCLOSURE OF THE INVENTION

Technical Problems

The object of the present invention is to tackle the bottleneck problems of the existing silicon wafer MWS methods, for example, as grinding is dominant, the large mechanical cutting force limits the further reduction of the diameter of the steel wires and makes it difficult to further reduce the thickness of silicon wafers and the width of the kerf and hard to improve slicing efficiency and it impossible to meet the ever-increasing demand of silicon wafers (solar energy silicon wafers in particular); and to invent a method by which anode (silicon rod or silicon ingot) passivation (or corrosion) is combined while the metal slicing wires mechanically grind the silicon ingot by applying an external low-voltage continuous (or impulse) DC power supply, thereby reducing macroscopic cutting force and realizing grinding/electrolysis combined MWS process of large-size ultra-thin silicon wafers.

Specifically speaking, certain grinding force is maintained between the metal slicing wire and the silicon ingot, abrasive (free slurry typically is silicon carbide, and fixed abrasive typically is diamond micro powder) forms an electrolytic clearance (<0.02 mm) between the surface of the metal slicing wire (typically a steel wire) and the silicon ingot, meanwhile cutting fluid is supplied to the clearance, and a passive film is formed on the surface of the silicon ingot under the action of a DC electric field due to electrolysis; these electrolytic products and silicon material are continuously erased by the abrasive carried by the fast moving metal slicing wire, electrolysis will be continued after the fresh silicon surface is exposed and the material removal process is repeated without stop, thereby achieving the purpose of slicing.

The above-mentioned combined slicing method promotes improving of slicing efficiency and surface integrity and lowers the probability of wire fracture. Owing to the semiconductor characteristics of silicon wafers and the very low conductivity of the cutting fluid, the actual electrolytic current is smaller than the limit tolerable to the metal slicing wire, and the production requirement of simultaneously slicing hundreds of wafers can be met.

Technical Solution

A grinding/electrolysis combined multi-wire-slicing processing method for silicon wafers, characterized in that:

Firstly, the metal slicing wire on a multi-wire slicing machine is used as a tool electrode (cathode), the wire travelling speed is adjustable in the range of 100~1000 m/min, the tension is controlled in the range of 10~40N, and the silicon rod or silicon ingot (anode) is subject to grinding/electrolysis combined slicing processing;

Secondly, during the processing, the metal slicing wire and the silicon rod (or silicon ingot) are externally connected to a low-voltage continuous (or impulse) DC power supply by a dedicated power input method. The voltage amplitude is adjustable in the range of 0~30V and the duty cycle is adjustable in the range of 0~10 as long as the requirements of anode passivation (or corrosion) are met;

Thirdly, cutting fluid with conductivity of below 500 $\mu S/cm$ is sprayed in the slicing zone to meet the requirements of cooling and anode passivation (or corrosion).

Said metal slicing wires are copper plating alloy steel wires or diamond fixed abrasive spring steel wires for multi-wire slicing machine, with a diameter of less than 0.2 mm.

Said silicon rod is made of doped or intrinsic monocrystalline silicon material, and said silicon ingot is made of doped or intrinsic polycrystalline silicon material.

Said cutting fluid is aqueous cutting fluid which is exclusively for multi-wire slicing machines and available on the current market. If necessary, other additives conducive to grinding/electrolysis may be added, provided that the normal service life and working condition of the multi-wire slicing machines are not affected.

Beneficial Effects

1. Electrolysis is favorable to reduce mechanical cutting force. The slicing product plays a role of abrasive and may lower the probability of wire fracture and improve the slicing efficiency of silicon wafers.
2. Mechanical grinding effect makes for the continuity of electrochemical passivation (or corrosion), makes the mechanically damaged layers of the silicon wafers thinner and the surface more integral, reduces follow-up thickness reduction and improves the material utilization.
3. Thinner slicing wires and less (or thin) abrasive may be used, thereby reducing the thickness of silicon wafers and the width of the kerf and further improving the material utilization. Particularly to the silicon wafers of above 200 mm, the width of the kerf and the thickness of the silicon wafers may both be smaller than 150 $\mu m$, thereby breaking through the limit of conventional multi-wire-slicing process.
4. It provides a new technological approach for the development of MWS devices and may be easily transplanted to the existing or being researched and developed MWS devices.

REFERENCE NUMBERS

1—silicon rod or silicon ingot, 2—glass, 3—metal electrode, 4—binder, 5—metal substrate, 6—workbench, 7—machine tool body, 8—anode cable, 9—DC power supply, 10—metal slicing wire, 11—main wire roller, 12—cathode cable. 13—power input block, 14—nozzle.

DETAILED DESCRIPTION OF THE EMBODIMENTS

Below the present invention is further described in connection with the accompanying drawings and embodiments.

Figure 1:
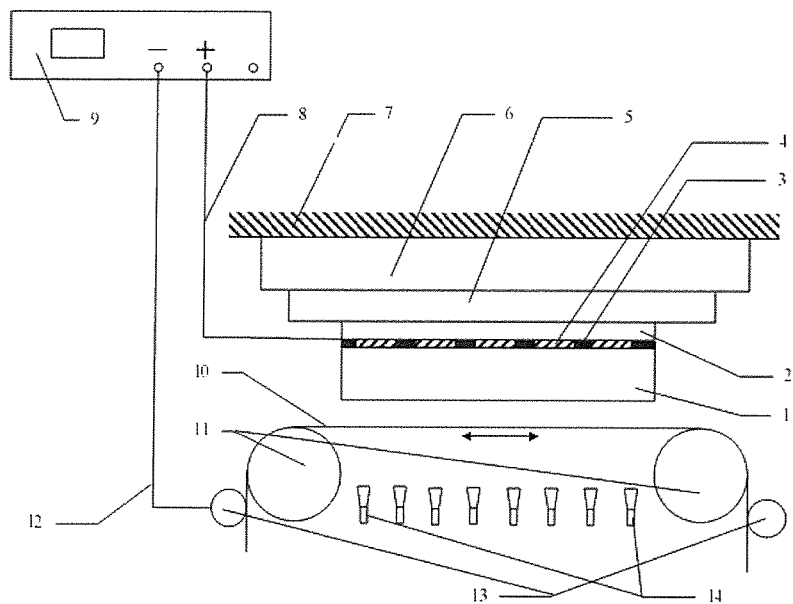
FIG. 1 is a schematic diagram of the method provided by the present invention.
Figure 2:
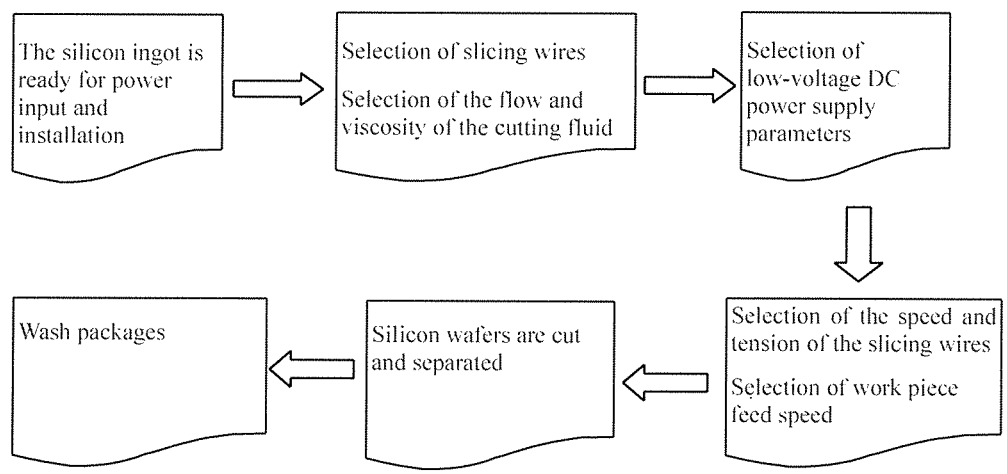
FIG. 2 is a schematic diagram of the realization process of the method provided by the present invention.

The grinding/electrolysis combined multi-wire-slicing method for silicon wafers is as shown in FIG. 1.

In the dedicated power input method for grinding/electrolysis combined multi-wire-slicing (MWS) of silicon wafers, a metal electrode 3 (such as a porous copper-clad-laminate and copper wire mesh, etc.) is added between the silicon rod or silicon ingot 1 and glass 2, binder 4 is used to bind the silicon rod or silicon ingot 1 and glass 2 together and ensure good conductivity between the silicon rod or silicon ingot 1 and the metal electrode 3, glass is mounted onto a metal substrate 5 through which the glass is positioned and mounted to a workbench 6 in a fixed manner. The electrical insulation with a machine tool body 7 is maintained. The lead-out part of the metal electrode 3 is connected to the anode of low-voltage continuous (or impulse) DC power supply 9 with an anode cable 8, thereby realizing the connection between the silicon rod or silicon ingot 1 and the anode of low-voltage continuous (or impulse) DC power supply 9, a metal slicing wire 10 passes through a main wire roller 11, a power input block 13 is connected to the cathode of low-voltage DC power supply 9 with a cathode cable 12, and the cutting fluid is sprayed out via a nozzle 14 during processing.

Embodiment 1

A grinding/electrolysis combined multi-wire-slicing processing method for solar energy silicon wafers, comprising the following steps:

① A solar energy silicon rod (ingot) is mounted onto the workbench of a multi-wire slicing machine tool. This workbench has a mechanism controlling lifting motion. The feed speed is 0.1~2 mm/min;

② The copper plating alloy steel wire and the silicon rod (or silicon ingot) are externally connected to a low-voltage continuous (or impulse) DC power supply. The voltage amplitude is adjustable in the range of 0~30V and the duty cycle is adjustable in the range of 0~10 as long as the requirements of anode passivation (or corrosion) are met. The selection of a continuous (or impulse) working mode may control the electrochemical effect;

The copper plating alloy steel wire is connected to the cathode of the power supply by adding power input devices at the locations where the copper plating alloy steel wire enters and leaves the slicing zone;

The silicon rod or silicon ingot is connected to the anode of the power supply, bound together with the glass on the workbench by binder and electrically insulated from the machine tool body.

③ The copper plating alloy steel wire enters the slicing zone through one-way or reciprocating motion. The wire feed speed is adjustable in the range of 100~1000 m/min.

④ Depending on the resistivity (typically 0.5~3 Ω·cm) of the solar energy silicon rod (ingot), the cutting fluid with conductivity of below 500 μS/cm is continuously sprayed in the slicing zone to meet the requirements of cooling and electrolysis;

Wherein the cutting fluid is aqueous cutting fluid. Its main component is basic substance such as polyethylene glycol (PEG) and so on. It may be used as either a water-based cutting fluid with high water content or a aqueous cutting fluid containing a few amount of water or free water. The latter is less corrosive to devices.

Silicon carbide abrasive with a particle size of below 20 μm is mixed into the cutting fluid at a ratio of 1:0.1~1 and evenly dispersed.

As disclosed by the above description, the parameters of the low-voltage DC power supply, power input mode and cutting fluid are important factors for assuring the implementation of the present invention.

Voltage amplitude, impulse width and duty cycle may be realized in a conventional circuit;

The power input mode is selected on the basic principle that no electric loop is formed with the machine tool body. The power input zone is selected on the principle that it is close to the processing zone;

Selection of the cutting fluid is an aqueous cutting fluid which is exclusively for multi-wire slicing machines and available on the current market. If necessary, other additives conducive to grinding/electrolysis may be added, provided that the normal service life and working condition of the multi-wire slicing machines are not affected.

This embodiment adopts copper plating alloy steel wires and silicon carbide free slurry to cut silicon wafers. As electrolysis is combined, positive impact will be generated to the particle shape and particle size of silicon carbide micro powder, the viscosity and flow of the cutting fluid and mortar, the velocity and tension of steel wires, work piece feed speed and other process factors. The concrete indicators are determined according to the actual processing condition.

Figure 3:
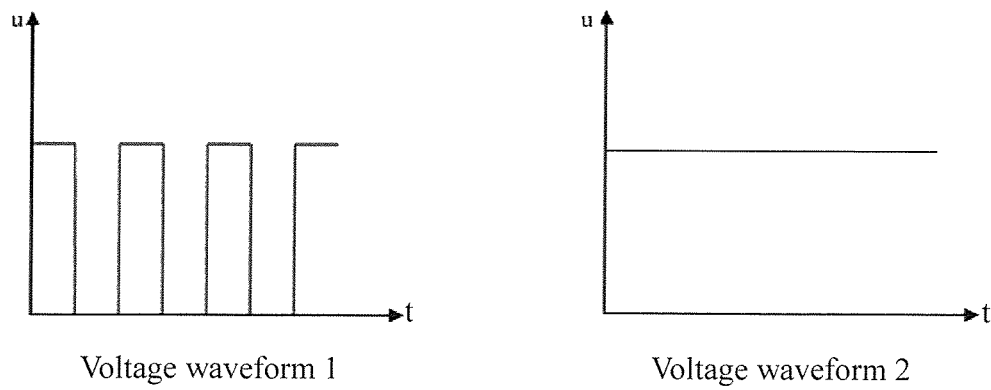
FIG. 3 is a schematic diagram of the non-load voltage waveform of a low-voltage DC power supply used to realize grinding/electrolysis combined processing.

The details are as follows:

A grinding/electrolysis combined multi-wire-slicing processing method for solar energy silicon wafers, comprising the following steps:

① A solar energy silicon rod (or silicon ingot) is prepared and mounted onto a workbench that may realize lifting motion. The lifting stroke of the workbench is greater than the diameter (or side length) of the silicon ingot;

② Copper plating alloy steel wires (wire diameter<0.2 mm) are selected based on the principle of grinding/electrolysis combined processing. The wire speed is adjustable (the range of adjustment is 100~1000 m/min) and constant tension is maintained (the range of adjustment is 10~40N);

③ The cutting fluid with appropriate conductivity (<500 μS/cm) is selected based on the resistivity of the solar energy silicon rod (ingot) (typically 0.5~3 Ω·cm);

④ In order to alleviate the impact of bubbles to the slicing process, a low-voltage impulse DC power supply (voltage amplitude is adjustable in the range of 0~30V and duty cycle is adjustable in the range of 1:10) is adopted to meet the requirement of generating electrochemical corrosion on the surface of silicon material, as shown in FIG. 3;

⑤ A corresponding servo control strategy is adopted. Different servo tracking strategy is adopted depending on different slicing speed of the silicon wafers;

⑥ When the slicing reaches the root of the silicon rod or silicon ingot, the externally connected low-voltage impulse DC power supply is switched off, electrolysis is cancelled and conventional multi-wire slicing mode is restored;

⑦ The silicon wafers are separated and washed after the slicing is finished. At this time, solar energy silicon wafers with good surface integrity (i.e., meeting the requirements on flatness, error of total thickness and surface quality) are obtained.

Embodiment 2

A grinding/electrolysis combined multi-wire-slicing processing method for solar energy silicon wafers, comprising the following steps:

① A solar energy silicon rod (or silicon ingot) is mounted onto the workbench of a multi-wire slicing machine tool. This workbench has a mechanism controlling lifting motion. The feed speed is 0.1~2 mm/min;

② The diamond fixed abrasive spring steel wire and the silicon ingot (or silicon rod) are externally connected to a continuous (or impulse) low-voltage DC power supply. The voltage amplitude is adjustable in the range of 0~30V and the duty cycle is adjustable in the range of 0~10 as long as the requirements of anode passivation (or corrosion) are met. The selection of a continuous (or impulse) working mode may control the electrochemical effect;

The diamond fixed abrasive spring steel wire is connected to the cathode of the power supply by adding power input devices at the locations where the diamond fixed abrasive spring steel wire enters and leaves the slicing zone;

The silicon rod or silicon ingot is connected to the anode of the power supply, bound together with the glass on the workbench by binder and electrically insulated from the machine tool body.

③ The diamond fixed abrasive spring steel wire enters the slicing zone through one-way or reciprocating motion. The wire feed speed is adjustable in the range of 100~1000 m/min.

④ Depending on the resistivity (typically 0.5~3 Ω·cm) of the solar energy silicon rod (or silicon ingot), cutting fluid with conductivity of below 500 μS/cm is continuously sprayed in the slicing zone to meet the requirements of cooling and electrolysis;

Wherein the cutting fluid is an aqueous cutting fluid. Its main component is basic substance such as polyethylene glycol (PEG) and so on. It may be used as either a water-based cutting fluid with high water content or an aqueous cutting fluid containing a few amount of water or free water. The latter is less corrosive to devices.

As disclosed by the above description, the parameters of the low-voltage DC power supply, power input mode and cutting fluid are important factors assuring the implementation of the present invention.

Voltage amplitude, impulse width and duty cycle may be realized in a conventional circuit;

The power input mode is selected on the basic principle that no electric loop is formed with the machine tool body. The power input zone is selected on the principle that it is close to the processing zone;

The cutting fluid is aqueous cutting fluid which is exclusively for multi-wire slicing machines and purchasable on the current market. If necessary, other additives conducive to grinding/electrolysis may be added, provided that the normal service life and working condition of the multi-wire slicing machines are not affected.

This embodiment adopts diamond fixed abrasive spring steel wires to cut silicon wafers. As electrolysis is combined, positive impact will be generated to the particle shape and particle size of diamond fixed abrasive, the viscosity and flow of the cutting fluid, the velocity and tension of steel wires, work piece feed speed and other process factors. The concrete indicators are determined according to the actual processing condition.

The details are as follows:

A grinding/electrolysis combined multi-wire-slicing processing method for solar energy silicon wafers, comprising the following steps:

① A silicon rod (or silicon ingot) to be processed is prepared and mounted onto a workbench that may realize lifting motion. The lifting stroke of the workbench is greater than the diameter (or side length) of the silicon ingot;

② Diamond fixed abrasive spring steel wires (wire diameter<0.2 mm) are selected based on the principle of grinding/electrolysis combined processing. The wire speed is adjustable (the range of adjustment is 100~1000 m/min) and constant tension is maintained (the range of adjustment is 10~40N);

③ The cutting fluid with appropriate conductivity (<500 μS/cm) is selected based on the resistivity of the solar energy silicon rod (ingot) (typically 0.5~3 Ω·cm);

④ As the diamond fixed abrasive spring steel wires are adopted for slicing, a low-voltage continuous DC power supply (voltage amplitude is adjustable in the range of 0~30V) is adopted to maintain the generation of electrochemical corrosion on the surface of silicon material, as shown in FIG. 3;

⑤ A corresponding servo control strategy is adopted. Different servo tracking strategy is adopted according to different slicing speed of the silicon wafers;

⑥ When the slicing reaches the root of the silicon rod or silicon ingot, the externally connected low-voltage DC power supply is switched off, electrolysis is cancelled and conventional multi-wire slicing mode is restored;

⑦ The silicon wafers are separated and washed after the slicing is finished. At this time, solar energy silicon wafers with good surface integrity (i.e., meeting the requirements on flatness, error of total thickness and surface quality) are obtained.

What is claimed is:

1. A grinding/electrolysis combined multi-wire-slicing processing method for silicon wafers, comprising:

firstly, a metal slicing wire on a multi-wire slicing machine tool is used as a tool electrode configured as a cathode and a silicon rod or silicon ingot configured as an anode is subject to grinding/electrolysis combined slicing processing by a dedicated power input method;

secondly, the metal slicing wire and the silicon rod or silicon ingot are externally connected to a low-voltage continuous or impulse DC power supply during the processing;

thirdly, cutting fluid is sprayed in the slicing zone in order to meet the requirements of slurry supply or cooling, product removal and anode passivation or corrosion;

said dedicated power input method comprises: a metal electrode (3) is added between the silicon rod or silicon ingot (1) and glass (2), binder (4) is used to bind the silicon rod or silicon ingot (1) and glass (2) together and realize good conductivity between the silicon rod or silicon ingot (1) and the metal electrode (3), glass (2) is mounted onto a metal layer (5) through which glass (2) is positioned and mounted to a workbench (6) in a fixed manner, an electrical insulation with a machine tool body (7) is maintained, a lead-out part of metal electrode (3) is connected to an anode of the low-voltage continuous or impulse DC power supply (9) with a cable (8), thereby realizing a connection between the silicon rod or silicon ingot (1) and the anode of low-voltage continuous or impulse DC power supply (9), a metal slicing wire (10) passes through a main wire roller (11), and a power input block (12) is connected to a cathode of low-voltage continuous or impulse DC power supply (9);

wherein the workbench (6) laterally protrudes beyond the edges of the metal layer (5); and wherein the machine tool body (7) laterally protrudes beyond the edges of the workbench (6).

2. The grinding/electrolysis combined multi-wire-slicing processing method for silicon wafers according to claim 1, wherein the metal slicing wires are copper plating alloy steel wires or diamond fixed abrasive spring steel wires used by multi-wire slicing machines, with a wire diameter of less than 0.2 mm, which move one-way or reciprocally, a wire feed speed is adjustable in the range of 100-1000 m/min and a tension is controlled in the range of 10-40 N and is adjustable.

3. The grinding/electrolysis combined multi-wire-slicing processing method for silicon wafers according to claim 1, wherein the silicon rod is made of doped or intrinsic monocrystalline silicon material, and the silicon ingot is made of doped or intrinsic polycrystalline silicon material.

4. The grinding/electrolysis combined multi-wire-slicing processing method for silicon wafers according to claim 1, wherein the voltage amplitude of the low-voltage continuous or impulse DC power supply is adjustable in a range of 0-30 V and a voltage impulse duty cycle is adjustable in a range of 0-10 V according to different slicing materials provided that requirements of anode passivation or corrosion are met.

5. The grinding/electrolysis combined multi-wire-slicing processing method for silicon wafers according to claim 1, wherein the cutting fluid is aqueous cutting fluid which is exclusively for multi-wire slicing machines and the conductivity is less than 500 μS/cm.

6. The grinding/electrolysis combined multi-wire-slicing processing method for silicon wafers according to claim 5, wherein other additives conducive to grinding/electrolysis are added provided that the additives do not affect normal service life and working conditions of the multi-wire slicing machine.

* * * * *